March 31, 1964
H. S. SOMMERS, JR
BIASING CIRCUITS FOR VOLTAGE CONTROLLED NEGATIVE RESISTANCE DIODES
3,127,574
Filed July 7, 1959
2 Sheets-Sheet 1

INVENTOR.
HENRY S. SOMMERS, JR.
BY Eugene M. Whitacre
ATTORNEY

March 31, 1964 H. S. SOMMERS, JR 3,127,574

BIASING CIRCUITS FOR VOLTAGE CONTROLLED NEGATIVE RESISTANCE DIODES

Filed July 7, 1959 2 Sheets-Sheet 2

INVENTOR.
HENRY S. SOMMERS, JR.
BY Eugene M. Whitacre
ATTORNEY 3,127,574

BIASING CIRCUITS FOR VOLTAGE CONTROLLED NEGATIVE RESISTANCE DIODES

Henry S. Sommers, Jr., Princeton, N.J., assignor to Radio Corporation of America, a corporation of Delaware
Filed July 7, 1959, Ser. No. 825,483
20 Claims. (Cl. 331—107)

This invention relates to electric circuits for negative resistance diodes, and in particular biasing circuits for voltage controlled negative resistance diodes.

One form of negative resistance diode, which is known as a tunnel diode, exhibits a positive resistance characteristic for very small forward bias voltages, a negative resistance characteristic for intermediate values of forward bias voltages, and a positive resistance for higher values of forward bias voltages. Stated in another manner, as the forward voltage applied to a voltage controlled negative resistance diode is continuously increased from zero, the diode current first increases to a relatively sharp maximum value, then decreases to a relatively deep and broad minimum, and thereafter again increases. For presently known types of negative resistance germanium diodes, an exemplary voltage range over which the diode exhibits a negative resistance characteristic is from 50 to 350 millivolts (mv.). The negative resistance of the diode, which is the reciprocal negative slope of its current-voltage characteristic, depends on the construction of the diode.

For a voltage controlled negative resistance diode, establishing a stable operating point in the negative resistance region requires a biasing supply having an internal resistance of lower value than the negative resistance of the diode at the operating point. Since the negative resistance of the device may be quite small, often less than one ohm, the voltage source under these circumstances will have to supply an appreciable current at a low voltage, such as, for example, 150 mv. in some cases. Commercially available batteries at the present time which are commonly used in electronic equipment ordinarily have 1.5 volts terminal voltage for the lowest available tap, corresponding to the voltage produced by a single cell. To reduce this voltage to a voltage of 150 mv. at a few ohms is very wasteful of battery power. The problem becomes increasingly important when a number of negative resistance diodes are to be operated in parallel from the same voltage supply source.

The operation of negative resistance diodes from a voltage supply presents another serious problem in the suppression of parasitic oscillations in the external biasing circuit. This is because the negative resistance of the diode at the operating point exceeds the positive resistance of the biasing circuit, as mentioned above, and presents a resultant negative resistance to a tuned circuit comprised of the inductance of the bias circuit connection leads and the capacitance of the diode.

It is accordingly an object of this invention to provide improved electric circuits for negative resistance diodes.

It is a further object of this invention to provide an improved bias circuit for battery operated apparatus including negative resistance diodes and which uses battery power more economically.

Another object of this invention is to provide improved bias circuit means for negative resistance diodes which is terminated in a positive resistance to prevent the occurrence of parasitic oscillations therein.

In accordance with the invention, a positive resistance means is connected in parallel with the negative resistance diode. The resistance value of the positive resistance means is less than that of the negative resistance of the diode so that the parallel combination appears as a positive resistance to the biasing circuit for the diode. Since the bias circuit thus is terminated in a positive resistance, parasitic oscillations will not occur. Furthermore, under these conditions, the combination of the diode and the resistance means becomes a current controlled device which can be biased by a current source having a high internal impedance. Thus, in accordance with an embodiment of the invention, several negative resistance diodes, each with shunt resistance means, may be connected in series for biasing from the same current source, thus providing economical use of power from commercially available power sources, such as batteries.

Further in accordance with the invention, the resistance means is connected to the negative resistance diode in a manner that the combination appears as a negative resistance to an operating circuit, hereinafter referred to as an alternating current (A.C.) circuit coupled to the diode to provide oscillation, amplification or the like. By way of example, the resistance means may be connected across a resonant transmission line at a voltage null point, with the diode connected across the line at a point spaced from the resistance means to permit the diode to excite the desired mode in the line. A current source to bias the diode to its proper operating region is connected across the line at any suitable point. Since the resistance means is at a low impedance point in the line, it has little effect on the A.C. operation of the circuit, and permits the diode to appear as a negative resistance to the A.C. circuit. Alternatively, a suitable bridge circuit may be used, with the A.C. and bias circuits across different diagonals of the bridge so that the diode presents a negative resistance to the A.C. circuit and a positive resistance to the bias circuit.

Accordingly, a further object of this invention is to provide a circuit for converting a voltage controlled negative resistance device to a current controlled device without substantially affecting the operation of the A.C. circuit.

Another object of this invention is to provide improved circuit means for modifying the voltage-current characteristic of a negative resistance diode to present a positive resistance to a bias circuit connected with the diode and a negative resistance to an A.C. circuit connected with the diode.

A further object of this invention is to provide an improved biasing circuit for a plurality of voltage controlled negative resistance diodes connected as the active elements in different operating circuits wherein the diodes are connected in series with the current biasing source.

The novel features which are considered characteristic of this invention are set forth with particularity in the appended claims. The invention itself, however, both as to its organization and method of operation as well as additional objects and advantages thereof, will best be understood from the following description when read in connection with the accompanying drawings, in which:

Figures 1, 2, 3, 4, 5, 6, 7:
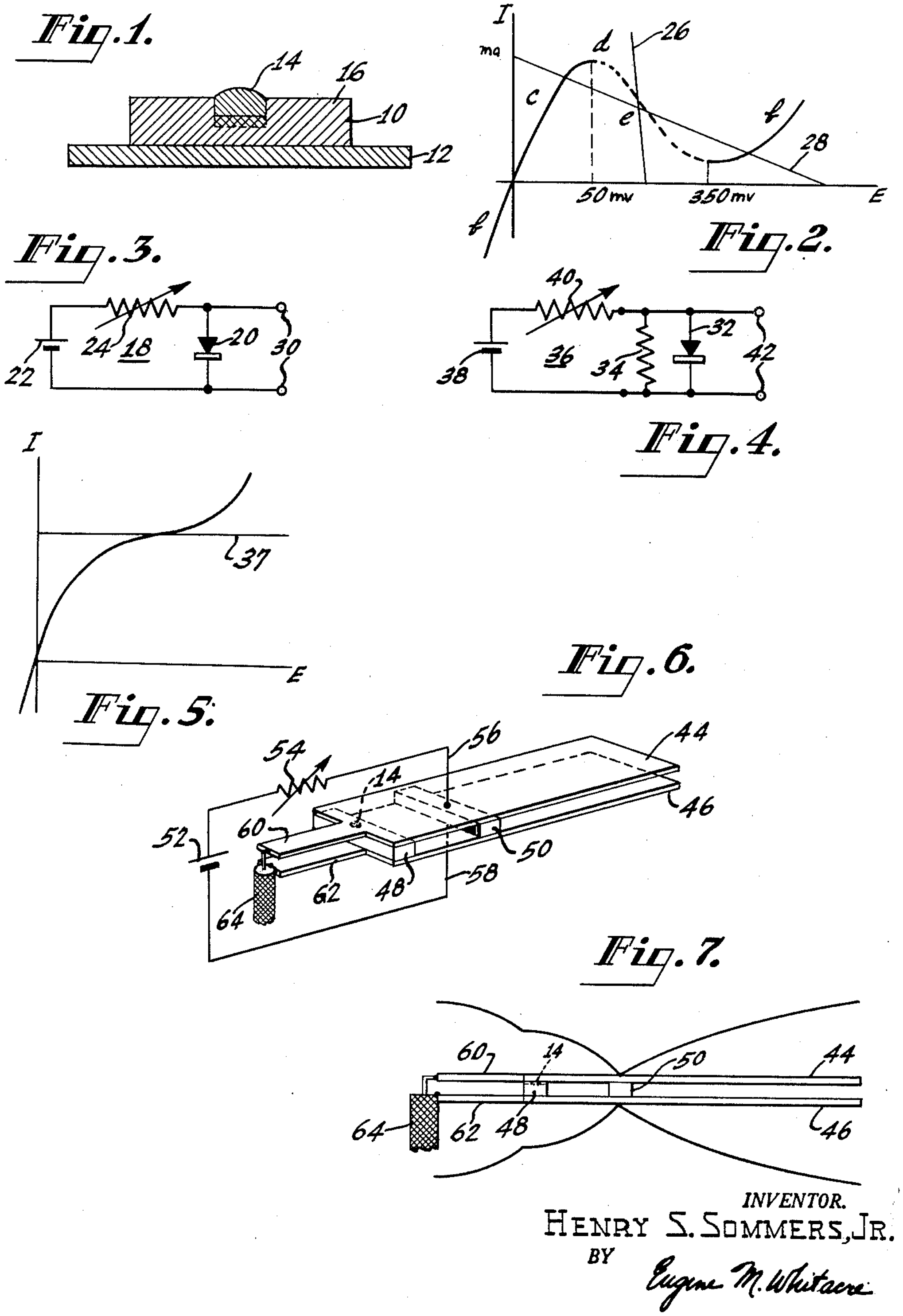
FIGURE 1 is a sectional view of a typical diode which may be used in circuits embodying the invention.
FIGURE 2 is a graph illustrating the voltage-current characteristic of a negative resistance diode of the type shown in FIGURE 1.
FIGURE 3 is a schematic circuit diagram of a D.C. bias circuit for the diode of FIGURE 1.
FIGURE 4 is a schematic circuit diagram of a D.C. bias circuit for the diode of FIGURE 1 embodying the invention.
FIGURE 5 is a graph illustrating the voltage-current characteristic across the diode when connected in the circuit configuration of FIGURE 4.
FIGURE 6 is a perspective view of a form of transmission line oscillator including a negative resistance diode, showing the D.C. circuit in schematic form in accordance with the invention.
FIGURE 7 is a graph illustrating the standing wave characteristics along the transmission line portion of the oscillator circuit shown in FIGURE 6.

Reference is now made to FIGURE 1 which is a diagrammatic sectional view of a typical negative resistance diode that may be used in the arrangement of the invention. By way of example, Leo Esaki, Physical Review, vol. 109, page 603, 1958, has reported a thin or abrupt junction diode exhibiting a negative resistance over a region of low forward bias voltages, i.e., less than 0.3 volt. The diode was prepared with a semiconductor having a free charge carrier concentration several orders of magnitude higher than that used in conventional diodes.

A diode which was constructed and could be used in practicing the invention includes a single crystal bar of n-type germanium which is doped with arsenic to have a donor concentration of $4.0\times10^{19}$ cm.$^{-3}$ by methods known in the semiconductor art. This may be accomplished, for example, by pulling a crystal from molten germanium containing the requisite concentration of arsenic. A wafer 10 is cut from the bar along the 111 plane, i.e. a plane perpendicular to the 111 crystallographic axis of the crystal. The wafer 10 is etched to a thickness of about 2 mils with a conventional etch solution. A major surface of this wafer 10 is soldered to a strip 12 of a conductor, such as nickel, with a conventional lead-tin-arsenic solder, to provide a non-rectifying contact between the wafer 10 and the strip 12. The nickel strip 12 serves eventually as a base lead. A 5 mil diameter dot 14 of 99 percent by weight indium, 0.5 percent by weight zinc and 0.5 weight percent gallium is placed with a small amount of a commercial flux on the free surface 16 of the germanium wafer 10 and then heated to a temperature in the neighborhood of 450° C. for one minute in an atmosphere of dry hydrogen to alloy a portion of the dot to the free surface 16 of the wafer 10, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. A suitable slow iodide etch is prepared by mixing one drop of a solution comprising 0.55 gram potassium iodide, and 100 cm.$^3$ water in 10 cm.$^3$ concentrated acetic acid, and 100 cm.$^3$ concentrated hydrofluoric acid. A pigtail connection may be soldered to the dot where the device is to be used at ordinary frequencies. Where the device is to be used at high frequencies, contact may be made to the dot with a low impedance lead.

A semiconductor device, prepared according to the above example, exhibits the following characteristics:

$\overline{R}$=1 ohm (Ω)
C=500 micro microfarads (μμf.)
$\overline{R}C$=0.5 millimicroseconds (mμs.).

Where $\overline{R}$ is the average value of the negative resistance from current maximum to current minimum; C is the capacitance of the junction at the operating point of the diode; and $\overline{R}C$ is the approximate time constant determining the frequency characteristic of the diode.

Other semiconductors may be used instead of germanium, particularly silicon and the III–V compounds. A III compound is a compound composed of an element from group III and group V of the periodic table of chemical elements, such as gallium arsenide, indium arsenide and indium antimonide. Where III–V compounds are used, the p and n type impurities ordinarily used in those compounds are also used to form the diode described. Thus, sulfur is a suitable n-type impurity and zinc a suitable p-type impurity which is also suitable for alloying.

The current-voltage characteristic of a typical diode suitable for use with circuits embodying the invention is shown in FIGURE 2. The current scales depend on area and doping of the junction, but representative currents are in the milliampere range.

For a small voltage in the back direction, the back current of the diode increases as a function of voltage as is indicated by the region *b* of FIGURE 2.

For small forward bias voltages, the characteristic is symmetrical (FIGURE 2, region *c*). The forward current results due to quantum mechanical tunneling. At higher forward bias voltages, the forward current due to tunneling reaches a maximum (region *d*, FIGURE 2), and then begins to decrease. This drop continues (FIGURE 2, region *e*) until eventually normal injection over the barrier becomes important and the characteristic turns into the usual forward behavior (region *f*, FIGURE 2).

The negative resistance of the diode is the incremental change in voltage divided by the incremental change in current, or the reciprocal slope of the region *e* of FIGURE 2. To bias the diode for stable operation in the negative resistance region of its characteristic requires a suitable voltage source having a smaller internal impedance than the negative resistance of the diode. As shown in FIGURE 3 the voltage source 18 may comprise a battery 22 and a variable resistor 24, with the internal resistance of the source being the sum of the internal resistance of the battery 22 and the adjusted resistance of the variable resistor 24. Such a voltage source has a D.C. load line 26 as indicated in FIGURE 2, which is characterized by a current-voltage relationship which has a greater slope than the negative slope of the diode characteristic and intersects the diode characteristic at only a single point. If the voltage source 18 has an internal resistance which is greater than the negative resistance of the diode, the source would have a load line 28 with a smaller slope than the negative slope of the diode characteristic as indicated in FIGURE 2, and would intersect the diode characteristic curve at three points. Under the latter conditions the diode is not stably biased in the negative resistance region. This is because an incremental change in current through the diode due to transient or noise currents or the like produces a regenerative reaction which causes the diode to assume one of its two stable states represented by the intersection of the load line 28 with the positive resistance portions of the diode characteristic curve.

When several negative resistance diodes are to be biased from the same D.C. voltage source, they are best suited for connection in parallel. However, most commercially available batteries do not provide a terminal voltage of less than one and one-half volts, and to reduce this voltage to the small value necessary to properly bias the diode in the negative resistance region of its characteristic curve (on the order of 150 mv., for example) at a few ohms resistance is wasteful of battery power. Furthermore it may be noted that since the negative resistance of the diode exceeds the positive resistance in the bias circuit, a resultant negative resistance appears in the bias circuit. This negative resistance in combination with the inductance of the connection leads in the bias circuit and the capacity of the diode tends to produce spurious oscillations, which may adversely affect an A.C. circuit which is connected to the terminals 30.

In accordance with the invention the negative resistance diode is converted from a voltage controlled device to a current controlled device in a manner that the resultant resistance presented to the bias circuit is positive, thereby reducing the susceptibility of the bias circuit to parasitic or spurious oscillations. A D.C. biasing circuit for the diode in accordance with the invention is shown in FIGURE 4.

In this circuit a negative resistance diode 32 is shunted by a resistor 34 which has lower positive resistance than the negative resistance of the diode. The current-voltage characteristic for the combination of the diode 32 and resistor 34 is shown in FIGURE 5. It will be noted that as the forward bias applied to the combination of the diode and the resistor is increased from zero, the current continuously increases, and no negative slope is exhibited. Thus, the diode may be controlled by a current source 36 having a high internal impedance. The load line 37 for the current source 36 is shown in FIGURE 5. The current source 36 includes a battery 38 and a variable resistor 40 of high resistance which may be adjusted to provide the desired current through the diode 32. Since the resistor 34 has a smaller resistance value than the negative resistance exhibited by the diode 32 a net positive resistance is presented to the D.C. current source 36, thereby preventing parasitic oscillations in the D.C. circuit. Furthermore, since the diode is current controlled several negative resistance diodes included in different signal translating stages may be connected in series for biasing to provide economical use of the battery power.

In order that the diode 32 may effectively act as an active circuit element in an A.C. circuit, the diode must present a negative resistance to the terminals 42. One manner in which this may be accomplished is illustrated in FIGURE 6, which shows a resonant transmission line oscillator. The oscillator comprises a pair of parallel transmission line conductors 44 and 46. The transmission line may comprise electrically conductive sheets or ribbons having opposed major surfaces which may be separated by suitable insulation means, not shown. The particular dimensions of the conductors 44 and 46 are selected to provide the desired frequency of resonance in the system at a predetermined characteristic impedance.

A negative resistance diode 48 is mounted between the conductors 44 and 46 at one end thereof, with the wafer 10 being connected to the inner surface of the conductor 46 by any convenient method which provides good ohmic contact between the wafer and the conductor. In this instance the conductor 46 may serve the purpose of the strip 12 referred to in connection with FIGURE 1. The other electrode 14 of the negative resistance diode is connected to the inner surface of the conductor 44, for example, by means of a drop of solder which may comprise 99 parts lead and 1 part indium by weight.

A non-inductive resistor 50 which may comprise a wafer of high conductivity germanium, is connected between the conductors 44 and 46 at a point close enough to the diode so that the intervening inductance is unimportant compared to the effective inductance of the desired mode of oscillation. The resistor 50 is connected to the conductors 44 and 46 at a point where the standing wave voltage for the desired mode of oscillation is a minimum, and therefore, the resistor 50 does not appreciably damp oscillations in the circuit. The D.C. bias for the diode 48 is provided by a current source which includes a battery 52 and a variable resistor 54 of suitable resistance. Connections from the current source including the conductors 56 and 58 are connected to the transmission line conductors 44 and 46 respectively at points thereon adjacent the resistor 50. The variable resistor 54 is adjusted to provide the necessary current to bias the diode 48 at the desired point in the negative resistance region of its characteristic. If further isolation is desired between the bias circuit and the operating (A.C.) circuit, suitable filter, not shown, may be connected between the bias circuit and the points of connections of the conductors 56 and 58 to the transmission line without impairing the oscillator performance.

Oscillatory energy is derived from the transmission line by means of an impedance matching device comprising the parallel conductors 60 and 62 which form extensions of the transmission line conductors 44 and 46. The dimensions of the conductors 60 and 62 are selected to provide the desired impedance transformation between the resonant transmission line and a suitable load which may comprise circuits, not shown which are connected to a coaxial cable 64.

The standing wave pattern along the resonant transmission line and the impedance matching device is shown in FIGURE 7. Since the transmission line is operating in the quarter wave mode, a voltage maximum exists near the free end thereof and decreases to a minimum at a point where the non-inductive resistor 50 is connected. Thereafter the voltage increases toward the opposite end of the line. This configuration has the advantage of giving a voltage step-up from the diode to the open end of the line thus permitting the low impedance diode to be matched to a standard impedance line. The voltage along the matching device including the conductors 60 and 62 increases to a maximum at the free end thereof.

For operation, the negative resistance diode is biased at an operating point in the negative resistance region of its characteristic curve, by adjusting the variable resistor 54. Since the negative resistance of the diode 48 is larger than the positive resistance of the resistor 50, the combination appears as a net positive resistance to the D.C. circuit, so that parasitic oscillations will not occur in the D.C. circuit. Undesired modes of oscillation of the transmission line are not sustained because of the damping action of the resistor 50.

To oscillate the A.C. resonant circuit must have a multi-valued intersection of the load line with the diode voltage-current characteristic similar to the load line 28 shown in FIGURE 2. This load line will exist at any frequency where the Q of the resonant circuit exceeds the effective Q of the diode. The effective Q of the diode may be defined by the formula $$\frac{1}{\omega RC}$$

wherein R corresponds to the negative resistance of the diode and C corresponds to the capacity across the diode.

Since the resistor 50 is at a voltage null point along the transmission line conductors 44 and 46, which corresponds to a low impedance point, this resistor has little effect on the transmission line operation, and the diode presents a negative resistance to the transmission line conductors 44 and 46 to produce oscillation. The resultant oscillatory energy is coupled through the impedance matching device including the conductors 60 and 62 to the load. The transmission line can be tuned over a range of frequencies by changing the D.C. operating point of the diode or by changing the physical length of the conductors 44 and 46. For very large frequency changes the position of the resistor 50 may have to be changed. Alternatively, tuning of the oscillator may be effected by terminating the open end of the transmission line with a variable capacitance means.

Figure 8:
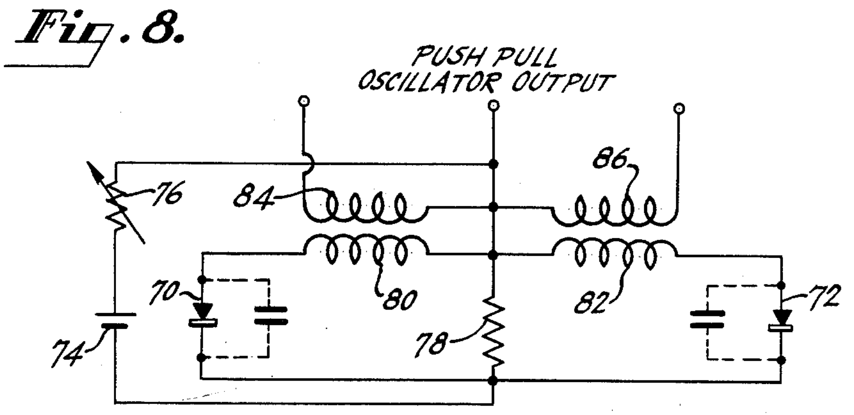
FIGURE 8 is a schematic circuit diagram of a push-pull oscillator including negative resistance diodes connected in accordance with the invention.

The negative resistance diode may be connected in other ways to present a positive resistance to the biasing circuit and a negative resistance to the A.C. circuit. FIGURE 8 illustrates an example of such connections in a push-pull oscillator circuit configuration. In this circuit a pair of diodes 70 and 72 are biased by a D.C. current source including a battery 74 and a variable resistor 76 of high resistance, to a desired point in the negative resistance characteristic thereof. To convert the diodes from voltage controlled devices to current controlled devices a resistor 78 which has a resistance value lower than the effective combined negative resistance of the diodes 70 and 72 is connected in parallel with each of the diodes 70 and 72. The oscillator includes a pair of resonant circuits tuned to the same resonant frequency, one of which is comprised of an inductor 80 in parallel with the effective capacitance of the diode 70, and the other of which comprises an inductor 82 in parallel with the effective capacitance of the diode 72. At the operating frequency the Q of each of the resonant circuits exceeds the effective Q of the diode with which it is associated to establish a condition under which the circuit will oscillate. Push-pull oscillations may be derived from the oscillator by a pair of inductors 84 and 86 which are coupled respectively with the oscillator tuned circuit inductors 80 and 82.

Since the positive resistance of the resistor 78 is less than the combined negative resistance presented by the diodes 70 and 72, the combination presents an effective positive resistance to the D.C. circuit so that parasitic oscillations will not be sustained. However, the diodes 70 and 72 present an effective negative resistance to their respective tank circuits. This is because as the current through the diode 70 begins to increase, the current through the diode 72 decreases. Since the currents through both the diodes flow through the resistor 78 and are 180° out of phase they tend to cancel and the net effect produces negligible A.C. voltage across the resistor 78 at the resonant frequency. Accordingly since the resistor 78 is connected across substantially equal A.C. potential points it has little effect on oscillator circuit operation. It will be noted that the low resistance of the resistor 78 tends to suppress undesired modes of oscillation since currents of such modes therethrough will not be cancelled.

Figures 9, 10, 11, 12:
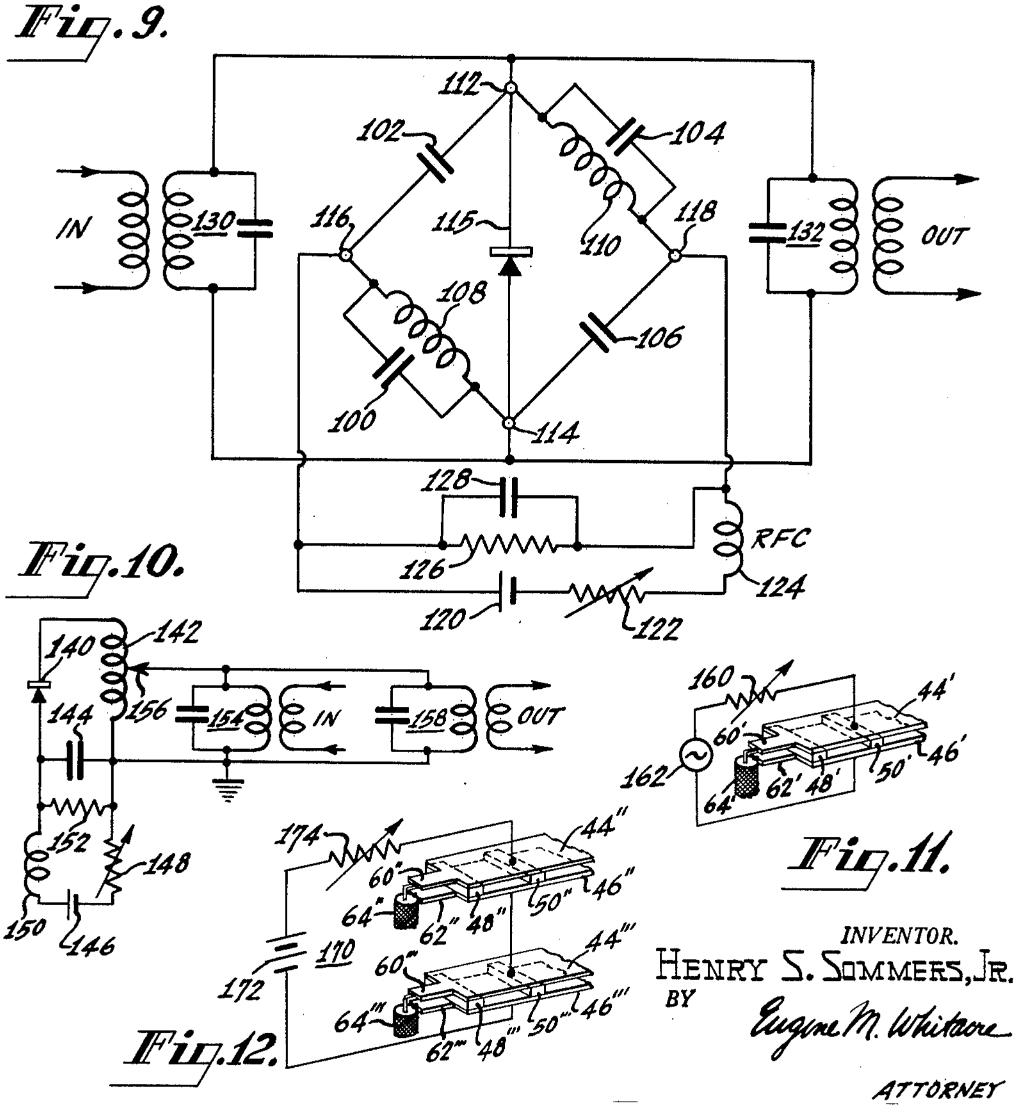
FIGURE 9 is a schematic circuit diagram of an amplifier circuit including a negative resistance diode connected in accordance with the invention.
FIGURE 10 is a schematic circuit diagram of a negative conductance amplifier including a biasing circuit in accordance with the invention.
FIGURE 11 is a schematic circuit diagram of an oscillator including a negative resistance diode which is biased from an alternating current source.
FIGURE 12 is a perspective view of a pair of transmission line oscillators, each including a negative resistance diode, with the diodes being connected in series for biasing in accordance with the invention.

The biasing circuit may be isolated from the operating or A.C. circuit by means of a bridge circuit arrangement as shown in FIGURE 9, which is a schematic circuit diagram of a tuned frequency amplifier. The bridge circuit includes the capacitors 100, 102, 104 and 106. A negative resistance diode 115 is connected across one diagonal of the bridge circuit defined by the terminals 112 and 114, and the biasing current source for the diode, including a battery 120 and variable resistor 122 in series with a radio frequency choke coil 124, is connected across the other diagonal of the bridge as defined by the terminals 116 and 118. To complete the D.C. biasing current path to the diode 115 a pair of inductors 108 and 110 are connected in parallel with the capacitors 100 and 104, respectively.

In order to convert the voltage controlled diode to a current controlled device, a resistor 126 is also connected between the terminals 116 and 118. The resistor 126 is selected to have a positive resistance which is less than the apparent negative resistance of the diode 115 presented to the terminals 116 and 118. The resistor 126 serves to suppress parasitic or spurious oscillations in the biasing circuit and accordingly is preferably connected as close as possible to the bridge terminals 116 and 118. If desired, a signal bypass capacitor 128 may be connected in parallel with the resistor 126 to provide a low impedance path for A.C. signals which may occur between the terminals 116 and 118 due to an unbalance of the bridge circuit.

The amplifier includes an input circuit 130 connected between the terminals 112 and 114 which is tuned to the frequency of the signals to be amplified. A signal output circuit 132 is also connected between the terminals 112 and 114 for developing thereacross the amplified signal energy.

The inductors 108 and 110 which convey the biasing current for the diode 115 are selected to resonate with their respective shunt capacitors 100 and 104 at a frequency which is low in comparison to the amplifier tuned frequency. Thus, these circuits appear effectively as capacitors at the signal frequency. The capacitors 102 and 106 and the effective capacitances of the circuits 100—108 and 104—110 are selected so that substantially no A.C. signal voltage appears between the terminals 116 and 118 due to the A.C. energy across the terminals 112 and 114. Accordingly, the small resistance of the resistor 126 between the terminals 116 and 118 provide substantially no damping on the signal circuits. The resistor 122 is adjusted to provide the necessary current to bias the diode 115 at a desired point in the negative resistance region of its current voltage characteristic.

For stable amplification, the combined conductance of the input and output circuits 130 and 132 should exceed the effective negative conductance of the diode 115. Signal voltage developed across the tuned input circuit 130 is impressed across the diode 115 and the output circuit 132, and causes currents to flow through these circuits. However, the signal voltage impressed across the diode 115 causes a change in current flow therethrough which is in the opposite direction to the change in current flow through the output circuit 132. Thus, the diode current is in a direction to add to the current in the output circuit and produce a gain. The expression for power gain in the amplifier circuit may be expressed as:

$$\frac{4G_L G_G}{(G_L+G_G-G_R)^2}$$

wherein $G_L$ is the conductance of the output circuit 132, $G_G$ is the conductance of the input circuit 130 and $-G_R$ is the effective negative conductance of the diode 115.

FIGURE 10 is a schematic circuit diagram of an intermediate frequency amplifier incorporating a negative resistance diode 140. The capacitance of the diode 140 is tuned to the intermediate frequency by the inductance of an autotransformer 142. A capacitor 144 connected between the autotransformer 142 and the diode 140 serves as a blocking capacitor for the bias circuit. Biasing current for the diode 140 is provided by a current source including a battery 146 and a variable resistor 148. The biasing current source is connected to the anode of the diode 140 through an RF choke coil 150, and to the cathode of the diode 140 through the autotransformer 142. A resistor 152 which is connected effectively across the diode 140, and has a positive resistance value which is less than the negative resistance value of the diode 140 converts the diode from a voltage controlled device to a current controlled device.

Alternating current signal energy of the intermediate frequency to be amplified is applied to the circuit by way of a tuned input circuit 154, which is connected between a tap 156 on the autotransformer 142 and a point of reference potential. Amplified signal energy is derived from the tank circuit between the tap 156 and a point of reference potential and is developed across a load circuit 158 that may be coupled to suitable utilization means. The tap 156 is selected to match the input and output circuits to the impedance of the diode, such that the negative conductance of the diode appears less than the positive conductance of the input and output circuits combined. As mentioned above, for stable amplification, the combined conductance of the output circuit and input circuit must exceed the negative conductance of the diode as transformed between terminal 156 and reference potential.

Since the capacitor 144 is of low impedance to signal frequency currents, the resistor 152 is connected between points of substantially the same A.C. potential, and therefore does not load the A.C. circuits. Furthermore, the resistor 152 causes the biasing circuit to be terminated in a positive resistance so that parasitic oscillations do not occur.

For pulse operation or for modulation circuits, such as frequency modulation circuits, it may be desirable to use an alternating current or pulsed biasing of a negative resistance diode, as shown in the oscillator circuit of FIGURE 11. The circuit of FIGURE 11 is similar to that shown in FIGURE 6 with the exception that an alternating current bias source has been provided. The magnitude of the alternating current bias which is applied to the diode may be set to the proper value by adjustment of the variable resistor 160. When the bias current from the source 162 causes the negative resistance diode to operate on the negative slope of its current voltage characteristic, the circuit will oscillate and will cause a burst of oscillation each time the bias swings through the negative slope. For a large magnitude of A.C. bias current, this will give two bursts for each cycle of biasing current. As described in connection with FIGURE 6, the resistor 50′ serves to convert the diode 48′ from a voltage controlled device to a current controlled device; causes the biasing source to be terminated with a positive resistance and thereby prevents parasitic oscillations in the biasing circuit; and damps undesired modes of oscillation which may tend to occur in the transmission line.

As hereinbefore set forth, a plurality of negative resistance diodes which comprise the active elements of different circuits such as oscillator circuits, amplifier circuits, detector circuits, etc., may be connected in series for biasing in accordance with the invention to obtain more efficient utilization of battery power. Such a circuit is shown in FIGURE 12, which includes a pair of oscillator circuits each of which is substantially the same as the oscillator circuit shown and described in connection with FIGURE 6, with the exception of the biasing circuit connections. Each of the oscillator circuits shown in FIGURE 12 includes a negative resistance diode 48″ and 48‴ respectively which are connected in parallel with the resistors 50″ and 50‴. As mentioned in connection with FIGURE 6 the resistors 50″ and 50‴ are connected at voltage null points along the transmission line so as to have little effect on the A.C. circuit operation. Biasing current for the diodes 48 and 48′ is provided by a current source 170 which includes a battery 172 and a variable resistor 174. The diodes 48″ and 48‴ are connected in series with the current source 170 and the resistor 174 is adjusted to provide the necessary current to bias the diodes at the desired point in their negative resistance characteristics. If desired, negative resistance diodes included in different types of stages could be connected in series for D.C. biasing purposes. For example, negative resistance diodes which comprise the active circuit elements of amplifiers, oscillators, mixers and the like, may all be connected in the same D.C. series circuit. Since the diodes in the series circuit are all current controlled devices, efficient utilization of power from a battery is obtained.

What is claimed is:

1. In an electrical circuit, a voltage controlled negative resistance device, an operating circuit coupled to said device, biasing circuit means including a resistance element having a positive resistance which is less than the absolute value of negative resistance of said device for biasing said device to exhibit a stable negative resistance to said operating circuit, and means connecting said resistance element across said device through at least a portion of said operating circuit.

2. In combination, an operating circuit, a voltage controlled negative resistance device coupled to said operating circuit, a stabilizing resistor having a positive resistance which is less than the absolute value of the negative resistance of said device, means including said operating circuit for direct current conductively connecting said resistor across said device, and biasing current means connected across said resistor, the magnitude of said biasing current and the value of said resistor being selected to stably bias said device to exhibit a negative resistance to said operating circuit.

3. In combination, a voltage controlled negative resistance device, a biasing current source for said device, an operating circuit, a resistor having a positive resistance less than the negative resistance of said device, and means including said operating circuit and said resistor for connecting said biasing current source to said device so that said device appears as a positive resistance to said source and as a negative resistance to said operating circuit.

4. The combination as defined in claim 3 wherein said biasing current source comprises an alternating current biasing source.

5. In an electrical circuit, a plurality of voltage controlled negative resistance diodes, operating circuit means connected to said diodes, a resistor for each of said diodes, the positive resistance value of a given resistor being less than the negative resistance of the diode with which said given resistor is associated, means connecting said resistors across the diode with which it is associated through at least a portion of said operating circuit means, means connecting said diodes in series, and a biasing current source connected across the series combination of said diodes.

6. A biasing circuit comprising in combination, a plurality of stages each including a negative resistance diode, each of said stages including a resistor having a lower positive resistance than the negative resistance of the diode associated therewith, means connecting the resistor in each of said signal translating circuits in parallel with its associated diode and at equipotential points in the signal translating circuit, means providing a current source, and means connecting said current source in series with a negative resistance diode in each of said signal translating circuits.

7. In combination, a negative resistance diode, bias current circuit means connected to said diode for biasing said diode to exhibit said negative resistance, alternating current circuit means connected with said diode, a resistor having a lower positive resistance than the negative resistance of said diode connected to said alternating current circuit means and said bias current circuit means to cause said diode to exhibit a resultant negative resistance to said alternating current circuit means and a resultant positive resistance to said bias current circuit means.

8. In combination, a negative resistance diode, alternating current circuit means having a pair of substantially equipotential terminals, means connecting said diode to said alternating current circuit means as an active circuit element, said equipotential points being direct current conductively connected to said diode, a resistor having a lower positive resistance than the negative resistance of said diode, means connecting said resistor to said alternating current circuit means between said pair of substantially equipotential points so that the combination of said resistor and said diode in parallel exhibit a resultant positive resistance, and bias current circuit means connected to said diode for biasing said diode to exhibit a negative resistance.

9. In combination, a negative resistance diode, means providing a direct current circuit connected for biasing said diode to exhibit a negative resistance characteristic, alternating current circuit means comprising a resonant transmission line including a pair of conductors, a resistor having a lower positive resistance than the negative resistance of said diode connected between the conductors of said transmission line at a voltage null, means connecting said diode between the conductors of said transmission line at a position spaced from said voltage null, and means connecting said direct current circuit between the conductors of said transmission line.

10. In combination, a negative resistance diode, means providing a direct current circuit connected for biasing said diode to exhibit a negative resistance characteristic, alternating current circuit means comprising a quarter wave resonant transmission line including a pair of spaced parallel conductors, means connecting said diode between said conductors at one end of said transmission line, a resistor having a positive resistance of lower value than the negative resistance of said diode connected between said conductors at a low impedance position spaced from said one end of said transmission line, and means connecting said direct current circuit between said conductors at a position adjacent the connection of said resistor.

11. An oscillator comprising a voltage controlled negative resistance device, resonant circuit means connected to said device, biasing means including a resistor having a positive resistance less than the negative resistance of said device, means including at least a portion of said resonant circuit means, connecting said resistor across said device, and a biasing current source for said device connected across said resistor.

12. An oscillator comprising in combination, a negative resistance diode; means providing a current source including a battery and a variable resistor connected in series, alternating current circuit means comprising a quarter wave resonant transmission line including a pair of spaced parallel conductors, means connecting said diode between said conductors at one end of said transmission line, a resistor having a positive resistance of lower value than the negative resistance of said diode connected between said conductors at a position spaced from said one end of said transmission line corresponding to a voltage null point, and means connecting said direct current circuit between said conductors at a position adjacent the connection of said resistor, said variable resistor being adjusted to bias said diode to exhibit a negative resistance.

13. A push-pull oscillator circuit comprising in combination, a first negative resistance diode, a first inductor resonant with the effective capacitance of said diode at said oscillator frequency, a resistor, means connecting said first diode and said first inductor and said resistor in a first loop circuit, a second negative resistance diode, a second inductor resonant with the effective capacitance of said second diode at said oscillator frequency, means connecting said second diode and said second inductor and said resistor to form a second loop circuit, said resistor having a positive resistance value less than the effective combined negative resistance of said first and second diodes, and means providing a current source connected across said resistor to bias said first and second diodes to exhibit a negative resistance in their respective resonant circuits.

14. A signal amplifier comprising in combination a voltage controlled negative resistance device, circuit means for a signal to be amplified connected across said negative resistance device, said circuit means having a pair of terminals of low impedance at the frequency of the signals to be amplified compared to the impedance of the portion of said circuit means connected across said negative resistance device, a resistor having a positive resistance value less than the negative resistance of said device, means connecting said resistor across said pair of terminals, and biasing current means connected across said resistor.

15. A negative conductance amplifier including a voltage controlled negative resistance diode, a signal input circuit and a signal output circuit effectively connected in parallel, means including a direct current blocking capacitor coupling said signal input circuit and signal output circuit across said diode, means providing a direct current biasing source connected in series with said diode and across said direct current blocking capacitor, and a resistor having a positive resistance less than the negative resistance of said diode connected in parallel with said capacitor.

16. In a tuned frequency negative conductance amplifier including a voltage controlled negative resistance diode, an inductor and a direct current blocking capacitor connected in series across said diode and resonant with the inherent capacitance of said diode at said tuned frequency, means providing a direct current source having a higher positive resistance than the negative resistance of said diode, and means connecting said direct current source to stably bias said diode to exhibit a negative resistance including a resistor of lower positive resistance than the negative resistance of said diode connected in parallel with said direct current blocking capacitor.

17. A negative conductance amplifier including a balanced bridge circuit having a first diagonal and a second diagonal, said second diagonal being between equipotential points for signals applied to said first diagonal, a negative resistance diode connected across said first diagonal, signal input and signal output circuits connected across said first diagonal, direct current biasing means connected across said second diagonal, and a resistor having a positive resistance less than the negative resistance of said diode connected across said second diagonal.

18. In combination, a negative resistance diode, an operating circuit means providing a current source for biasing said diode to exhibit a negative resistance characteristic, said current source being connected across said negative resistance diode, and resistance means having a lower positive resistance than the negative resistance of said diode, means connecting said resistor in said operating circuit in a manner that said resistor is decoupled from the diode at signal frequencies and is direct current conductively connected across said diode.

19. In combination; a negative resistance diode having a current-voltage relationship characterized by a positive slope for first range of forward bias voltages of relatively low magnitudes, a negative slope for second range of forward bias voltages of larger magnitudes, and a positive slope for a third range of forward bias voltages of still larger magnitudes; a bias source connected with said diode and having a higher series impedance than the reciprocal of said negative slope; and means for stably biasing said diode for operation in the negative slope region of its current-voltage relationship including a resistor having a positive resistance less than the negative resistance of said diode, an operating circuit coupled to said diode, and means connecting said resistor to said operating circuit in a manner that said resistor is decoupled from the diode at signal frequencies but is direct current conductively connected across said diode.

20. In combination, a negative resistance diode, means providing a direct current circuit connected for biasing said diode to exhibit a negative resistance characteristic, alternating current circuit means comprising a resonant transmission line including a pair of conductors, a resistor having a lower positive resistance than the negative resistance of said diode connected between the conductors of said transmission line, means connecting said diode between the conductors of said transmission line, the relative positions of said diode and said resistor being such that said resistor is sufficiently decoupled from said diode at signal frequencies that said direct current circuit biases said diode to exhibit a negative resistance to said transmission line.

References Cited in the file of this patent

UNITED STATES PATENTS

| | | |
|---|---|---|
| 2,585,571 | Mohr | Feb. 12, 1952 |
| 2,747,086 | McArthur | May 22, 1956 |
| 2,775,658 | Mason et al. | Dec. 25, 1956 |
| 2,843,765 | Aigrain | July 15, 1958 |

OTHER REFERENCES

Turner: "Tubeless Oscillator Uses A IN34 Crystal," Radio Electronics, October 1949, page 47.

Reich: "A Low Distortion Audio-Frequency Oscillator," Proc. IRE, vol. 25, No. 11, pages 1387 to 1398, November 1937.

Article: "Negative Resistance," by Roddam Wireless World, July 1954, pages 335–338.